(12) United States Patent
Hoshino et al.

(10) Patent No.: US 7,751,197 B2
(45) Date of Patent: Jul. 6, 2010

(54) FASTENING DEVICE, MODULE MOUNTING MECHANISM AND INFORMATION PROCESSING APPARATUS

(75) Inventors: Tsutomu Hoshino, Otsuki (JP); Akira Sugiyama, Tokyo (JP); Takeshi Yokomizo, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/603,345

(22) Filed: Oct. 21, 2009

(65) Prior Publication Data
US 2010/0124473 A1 May 20, 2010

(30) Foreign Application Priority Data
Nov. 20, 2008 (JP) .............................. 2008-296863

(51) Int. Cl.
*H05K 7/16* (2006.01)
*H05K 1/14* (2006.01)
*F16B 21/18* (2006.01)

(52) U.S. Cl. ........................ 361/740; 361/725; 361/736; 411/353

(58) Field of Classification Search ............ 361/679.01, 361/724–730, 732, 736, 740; 29/757, 760, 29/830; 211/26, 189; 411/353, 389, 397
See application file for complete search history.

(56) References Cited

U.S. PATENT DOCUMENTS

| | | | | |
|---|---|---|---|---|
| 3,138,188 A | * | 6/1964 | Tuozzo et al. ................ | 411/353 |
| 3,195,600 A | * | 7/1965 | Middleton, Jr ............... | 411/353 |
| 3,343,581 A | * | 9/1967 | Martin et al. ................ | 411/349 |
| 4,915,557 A | * | 4/1990 | Stafford ...................... | 411/353 |
| 5,312,005 A | * | 5/1994 | Odell ......................... | 411/389 |
| 5,338,139 A | * | 8/1994 | Swanstrom .................. | 411/353 |
| 6,279,754 B1 | * | 8/2001 | Hoss et al. ................... | 211/26 |
| 6,682,282 B2 | * | 1/2004 | Allen ......................... | 411/353 |
| 6,781,055 B2 | * | 8/2004 | Chen .......................... | 174/535 |
| 6,915,562 B2 | | 7/2005 | Joist et al. | |
| 6,955,512 B2 | * | 10/2005 | Allen et al. .................. | 411/353 |
| 7,028,389 B2 | * | 4/2006 | Chang ........................ | 411/339 |

(Continued)

FOREIGN PATENT DOCUMENTS

JP          57-002699       1/1982

(Continued)

*Primary Examiner*—Jayprakash N Gandhi
*Assistant Examiner*—Adrian S Wilson
(74) *Attorney, Agent, or Firm*—Blakely, Sokoloff, Taylor & Zafman LLP (57) ABSTRACT

According to one embodiment, a fastening device comprises an object having a through hole, and a fastener which fixes the object to a support by being screwed into a screw hole. The fastener includes a gripper and a stopper. The gripper is capable of protruding outside of the object from the through hole and getting into the through hole, and has an end surface on a side opposite to a male screw portion. The stopper is positioned between the male screw portion and the gripper. In a state in which the male screw portion is screwed into the screw hole, the end surface is positioned inside the through hole. In a state in which the male screw portion is removed from the screw hole, the gripper protrudes outside of the object from the through hole, and the stopper is caught in the object and holds the fastener to the object.

19 Claims, 6 Drawing Sheets

U.S. PATENT DOCUMENTS

| | | | |
|---|---|---|---|
| 7,034,223 B2 * | 4/2006 | Fan et al. | 361/753 |
| 7,227,761 B2 * | 6/2007 | Estes et al. | 361/810 |
| 7,290,971 B2 * | 11/2007 | Bakos | 411/353 |
| 7,364,442 B2 * | 4/2008 | Bang et al. | 439/92 |
| 7,466,562 B2 * | 12/2008 | Gilliland et al. | 361/803 |
| 2002/0102147 A1 * | 8/2002 | Mayer | 411/353 |
| 2003/0172523 A1 | 9/2003 | Joist et al. | |
| 2004/0034994 A1 * | 2/2004 | Chang | 29/760 |
| 2007/0285885 A1 * | 12/2007 | Lin | 361/684 |
| 2008/0037212 A1 * | 2/2008 | Wang | 361/685 |

FOREIGN PATENT DOCUMENTS

| | | |
|---|---|---|
| JP | 58-127692 | 8/1983 |
| JP | 61-168295 | 7/1986 |
| JP | 61-144975 | 9/1986 |
| JP | 3-117887 | 12/1991 |
| JP | 4-116191 | 10/1992 |
| JP | 5-267866 | 10/1993 |
| JP | 6-350274 | 12/1994 |
| JP | 8-264979 | 10/1996 |
| JP | 9-260875 | 10/1997 |
| JP | 2004-31899 | 1/2004 |

* cited by examiner

FASTENING DEVICE, MODULE MOUNTING MECHANISM AND INFORMATION PROCESSING APPARATUS

CROSS-REFERENCE TO RELATED APPLICATIONS

This application is based upon and claims the benefit of priority from Japanese Patent Application No. 2008-296863, filed Nov. 20, 2008, the entire contents of which are incorporated herein by reference.

BACKGROUND

1. Field

One embodiment of the invention relates to a fastening device which detachably fixes an object to be fixed using a fastener having a male screw portion, and a module mounting mechanism which detachably fixes a module inserted into a receptacle using a fastener having a male screw portion.

Further, the invention relates to an information processing apparatus in which a circuit module is detachably contained inside a housing.

2. Description of the Related Art

Jpn. Pat. Appln. KOKAI Publication No. 9-260875 discloses an information processing apparatus used in the field of communication systems, for example. An information processing apparatus of this kind comprises a box-shaped housing and a plurality of selectively detachable printed wiring board units inserted into the housing. The housing includes a receptacle for containing the printed wiring board units and an opening which is continuous with the receptacle. A connector is provided at an end of the receptacle facing the opening.

The printed wiring board unit comprises a wiring board on which electronic components such as IC chips are mounted, and a front panel fixed to one end of the wiring board. The wiring board is inserted into the receptacle of the housing from the opening. A tip portion of the wiring board is connected to the connector. The front panel blocks the opening of the housing when the wiring board is connected to the connector.

In the information processing apparatus disclosed in the above-described Japanese Patent Application KOKAI Publication, a fixing screw is provided at a central part of the front panel. The fixing screw is held by the front panel. The printed wiring board unit is fixed to the housing by fixing the fixing screw into a frame of the housing. The fixing screw has a columnar knob. The knob protrudes from a front surface of the front panel such that the operator can easily grip the knob with fingertips.

A handle is provided on the front panel of the printed wiring board unit. The handle is used by gripping it with fingertips when the printed wiring board unit is pulled out from the receptacle of the housing. The handle protrudes outside of the housing from the front panel.

In order to detach the printed wiring board unit from the housing, the fixing screw is loosened to release the front panel fixed to the housing. After that, by gripping the handle using fingertips and pulling the printed wiring board unit toward the operator, the printed wiring board unit can be pulled out of the housing from the receptacle.

According to the information processing apparatus disclosed in the above-described Japanese Patent KOKAI Publication, the knob of the fixing screw and the handle always protrude outside of the housing from the front panel of the printed wiring board unit even in a state in which the printed wiring board unit is fixed to the housing.

Such a configuration emphasizes existence of the knob and the handle, and loses unity between the front panel and the housing. Thereby, the outer appearance of the information processing apparatus is deteriorated.

Further, since extra space needs to be secured to contain the knob and the handle in front of the housing, there may be a restriction on the place where the information processing apparatus is provided.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a fastening device comprises a support having a screw hole, an object to be fixed having a through hole which is aligned with the screw hole, and a fastener which detachably fixes the object to be fixed to the support by being screwed into the screw hole from the through hole.

The fastener includes (i) a male screw portion which is screwed into the screw hole, (ii) a gripper coaxially provided with respect to the male screw portion, the gripper is capable of protruding outside the object to be fixed from the through hole and getting into the through hole, and having an end surface on which a concave portion, in which a tool can be engaged, is formed on an opposite side of the male screw portion, and (iii) a stopper positioned between the male screw portion and the gripper.

The object to be fixed is fixed to the support via the fastener and the end surface of the gripper is positioned inside the through hole, in a state in which the male screw portion of the fastener is screwed into the screw hole, and the gripper protrudes outside of the object to be fixed from the through hole and the stopper is caught in the object to be fixed and holding the fastener to the object to be fixed, in a state in which the male screw portion of the fastener is removed from the screw hole.

Hereinafter, a first embodiment of the present invention will be descried with reference to FIGS. 1-7.

Figure 1:
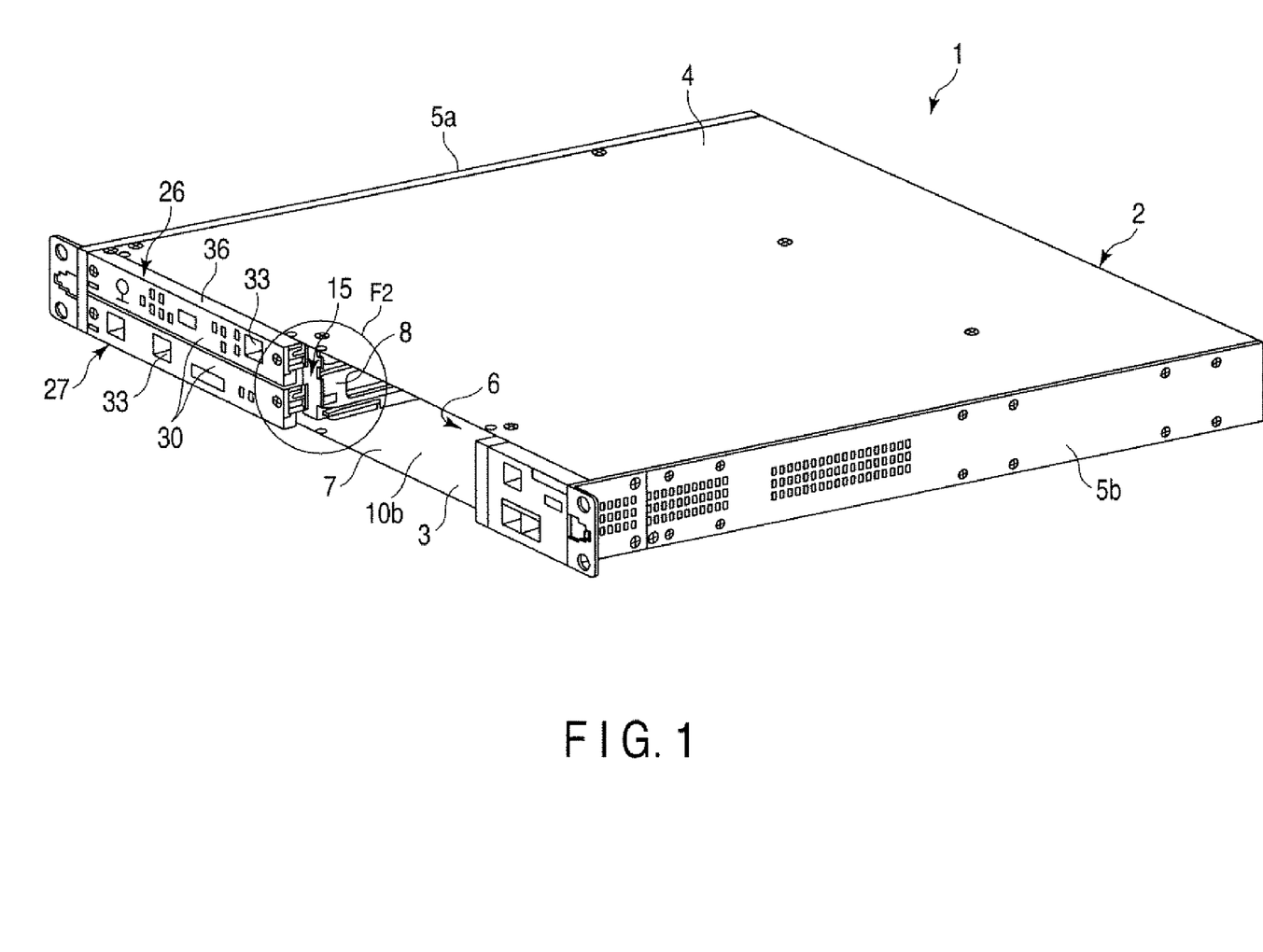
FIG. 1 is a perspective view of an exemplary information processing apparatus according to a first embodiment of the invention.

FIG. 1 discloses an information processing apparatus 1 such as a telephone exchange. The information processing apparatus 1 has a housing 2. The housing 2 is in the shape of a flat rectangular box having a bottom plate 3, a top plate 4, and right and left side plates 5a, 5b. According to the present embodiment, the housing 2 is formed of a metal material such as a steel plate and has electrical conductivity.

Figure 4:
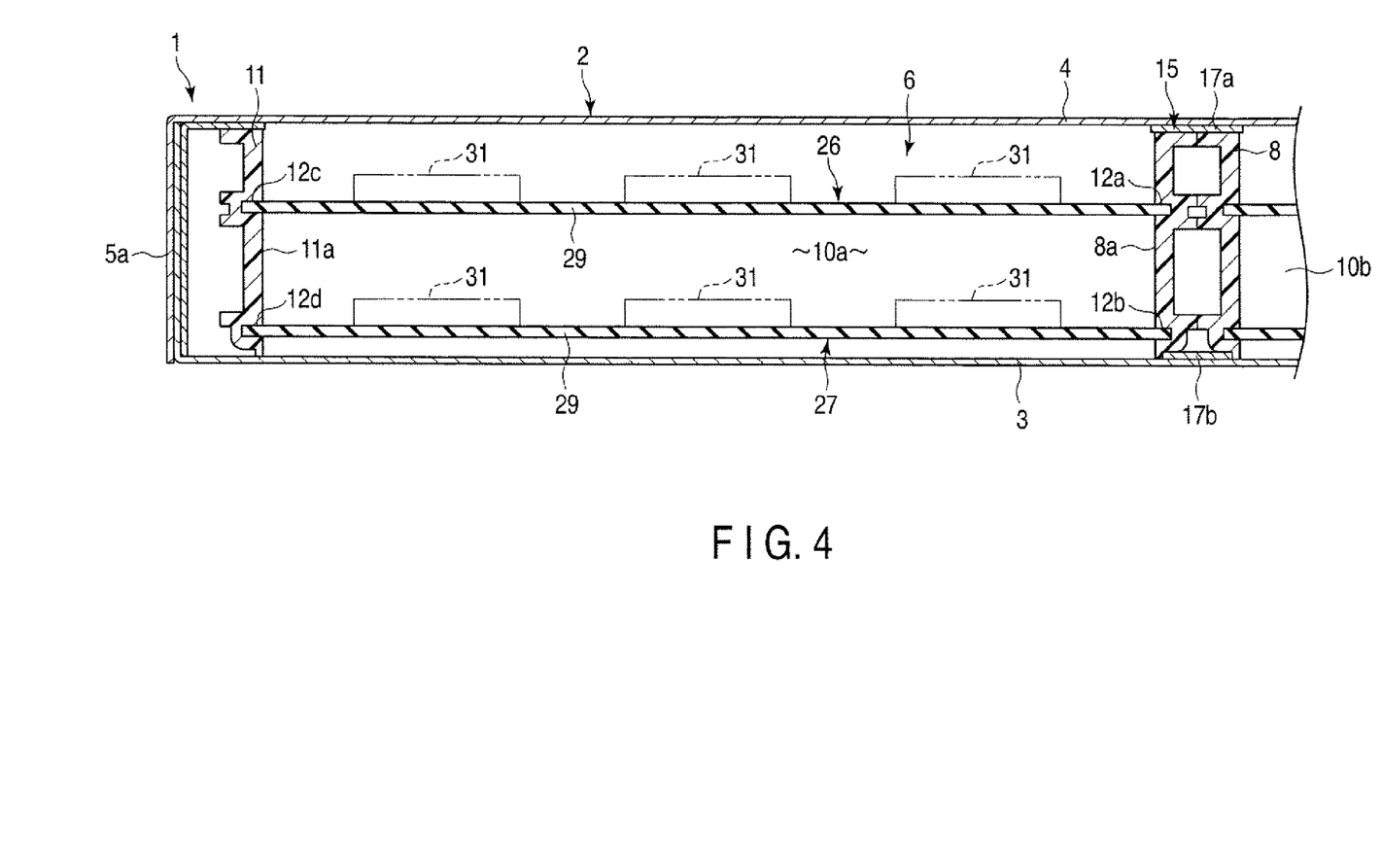
FIG. 4 is an exemplary cross-sectional view of an information processing apparatus according to a first embodiment of the invention.

As shown in FIGS. 1 and 4, the housing 2 has a receptacle 6 and an opening 7. The receptacle 6 is defined by a space surrounded by the bottom plate 3, the top plate 4, and the right and left side plates 5a, 5b. The opening 7 is rectangular in shape, continuous with the receptacle 6, and located at a front end of the housing 2.

The receptacle 6 is partitioned into a first receptacle 10a and a second receptacle 10b by a central partition wall 8 formed of synthetic resin. The central partition wall 8 is located at a center of the housing 2 in a width direction and extends straight in a depth direction of the housing 2. Accordingly, the first receptacle 10a and the second receptacle 10b are arranged side by side in the width direction of the housing 2.

Since the first receptacle 10a and the second receptacle 10b have a common configuration, the first receptacle 10a located at the left side of the central partition wall 8 will be described as a representative. As shown in FIG. 4, a guide wall 11 formed of synthetic resin is provided inside the first receptacle 10a. The guide wall 11 extends straight in the depth direction of the housing 2 along the side plate 5a at a left side of the housing 2.

The central partition wall 8 has a vertical wall surface 8a exposed to the first receptacle 10a. A first guide groove 12a and a second guide groove 12b are formed in the well surface 8a. The first and the second guide grooves 12a, 12b extend straight in a depth direction of the housing 2 and are arranged in parallel to each other at an interval in a height direction of the housing 2.

The guide wall 11 has a vertical wall surface 11a exposed to the first receptacle 10a. A third guide groove 12c and a fourth guide groove 12d are formed in the wall surface 11a. The third and fourth guide grooves 12c, 12d extend straight in a depth direction of the housing 2 and are arranged in parallel to each other at an interval in a hi ht direction of the housing 2.

The first guide groove 12a and the third guide groove 12c face each other in a width direction of the housing 2 in the first receptacle 10a. Similarly, the second guide groove 12b and the fourth guide groove 12d face each other in a width direction of the housing 2 in the first receptacle 10a.

Further, the first and second guide grooves 12a, 12b are open into a front end surface of the central partition wall 8 facing the opening 7. The third and fourth guide grooves 12c, 12d are open into the front end surface of the guide wall 11 facing the opening 7.

Figure 2:
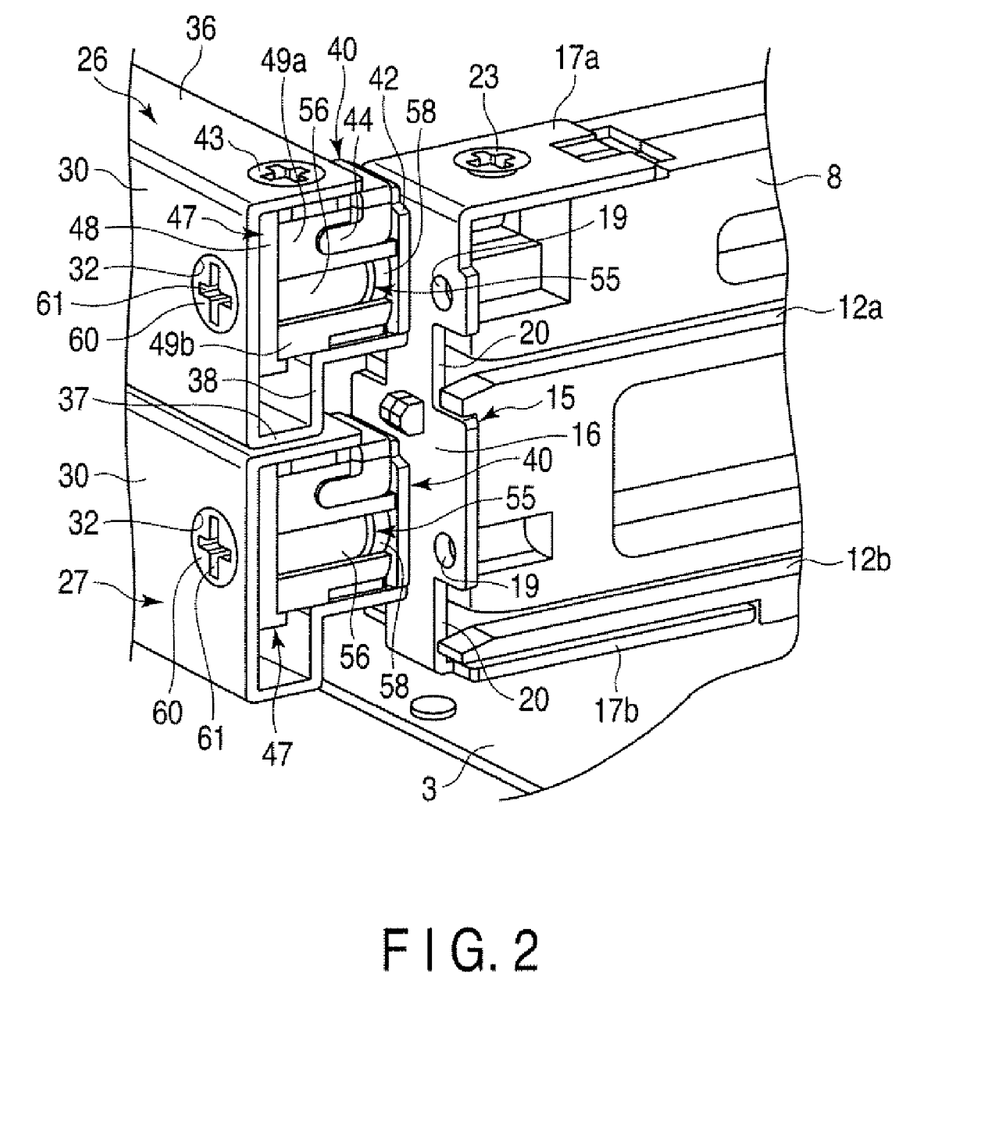
FIG. 2 is an exemplary perspective view enlarging the F2 part of FIG. 1.

As shown in FIG. 2, a metal fixing bracket 15 is attached to a front end of the central partition wall 8 facing the opening 7. The fixing bracket 15, which is an example of the support, has a standing plate 16, a first support piece 17a, and a second support piece 17b.

The standing plate 16 is held by a front end surface of the central partition wall 8 to stand up along the central partition wall 8. The first support piece 17a is bent at a right angle toward a rear side of the housing 2 from an upper edge of the standing plate 16 and lapped over an upper surface of the central partition wall 8. The second support piece 17b is bent at a right angle toward the rear side of the housing 2 from a lower edge of the standing plate 16 and lapped over a lower surface of the central partition wall 8.

Further, a pair of screw holes 19 and a pair of notches 20 are formed on a left portion and a right portion of the standing plate 16. The screw holes 19 are separated from each other in a height direction of the central partition wall 8, and face the opening 7 of the housing 2. The notches 20 are formed to expose an opening end of each of the first and second guide grooves 12a, 12b.

According to the present embodiment, although not shown, the fixing bracket 15 is also held by a rear end positioned on an opposite side of the opening 7 of the central partition wall 8, a front end of the guide wall 11 facing the opening 7, and a rear end of the guide wall 11 positioned on an opposite side of the opening 7.

Figure 5:
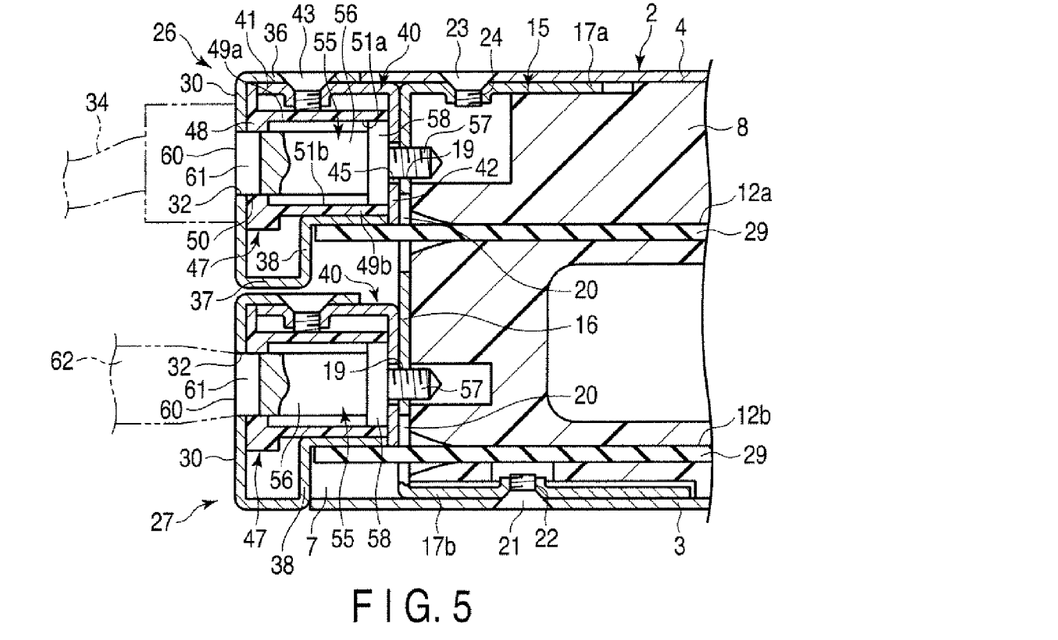
FIG. 5 is an exemplary cross-sectional view illustrating a state in which two circuit modules are fixed to a receptacle of a housing.

As shown in FIGS. 4 and 5, the bottom plate 3 of the housing 2 is lapped over the lower surface of the central partition wall 8 and a lower surface of the second support piece 17b of the fixing bracket 15. The bottom plate 3 is fixed to the second support piece 17b via a screw 21. The screw 21 is screwed into a screw hole 22 made in the second support piece 17b.

The top plate 4 of the housing 2 is lapped over the upper surface of the central partition wall 8 and an upper surface of the first support piece 17a of the fixing bracket 15. The top plate 4 is fixed to the first support piece 17a via a screw 23. The screw 23 is screwed into a screw hole 24 made in the first support piece 17a.

In the present embodiment, the central partition wall 8 and the guide wall 11 are supported by the bottom plate 3 and the top plate 4 of the housing 2 via the fixing bracket 15. Further, since the fixing bracket 15 contacts the bottom plate 3 and the top plate 4 of the housing 2, the fixing bracket 15 is electrically connected to the housing 2.

As shown in FIGS. 1, 4 and 5, two selectively detachable circuit modules 26, 27 are contained in the first receptacle 10a of the housing 2. The circuit modules 26, 27 are laminated in the height direction of the housing 2 in the first receptacle 10a.

The circuit modules 26, 27 have a common configuration. Accordingly, in the present embodiment, the circuit module 26, one of the two circuit modules located in an upper stage of the first receptacle 10a, will be described as a representative. The structural elements of the circuit module 27, the other one of the two circuit modules located at a lower stage of the first receptacle 10a, will be denoted by the same reference numerals as those of the structural elements of the circuit module 26, and detailed descriptions of those elements will be omitted.

The circuit module 26 has a printed circuit board 29 and a front panel 30. The printed circuit board 29 is inserted into the first receptacle 10a from the opening 7 of the housing 2. For example, a plurality of circuit components 31, such as IC chips, are mounted on an upper surface of the printed circuit board 29. As shown in FIG. 4, a right edge part of the printed circuit board 29 is slidably engaged in the first guide groove 12a of the central partition wall 8. A left edge part of the printed circuit plate 29 is slidably engaged in the third guide groove 12c of the guide wall 11. As a result, the printed circuit plate 29 is kept horizontal to straddle the central partition wall 8 and the guide wall 11.

In a state in which the printed circuit board 29 is completely inserted into the first receptacle 10a, a connection plug, not shown, located at a tip of the printed circuit board 29, is electrically connected to a connector provided inside the first receptacle 10a.

The front panel 30 is an example of the object to be fixed, and is positioned at one end of the printed circuit board 29. The front panel 30 is in the form of an elongated plate extending in a width direction of the housing 2. The front panel 30 blocks the opening 7 of the housing 2 when the printed circuit board 29 is completely inserted into the first receptacle 10a.

In a state in which the front panel 30 has blocked the opening 7, a front surface of the front panel 30 functions as an outer surface exposed to the outside of the housing 2, and a right end portion and a left end portion of the front panel 30 face the fixing bracket 15. At each of the right end portion and the left end portion of the front panel 30, a circular through hole 32, only one of which is shown, is formed. The through hole 32 is aligned with the screw hole 19 and has a diameter greater than that of the screw hole 19.

As shown in FIG. 1, a LAN connector 33 is supported by the front panel 30. The LAN connector 33 is exposed to the front surface of the front panel 30 so as to connect a LAN cable 34 shown in FIG. 5.

Figure 3:
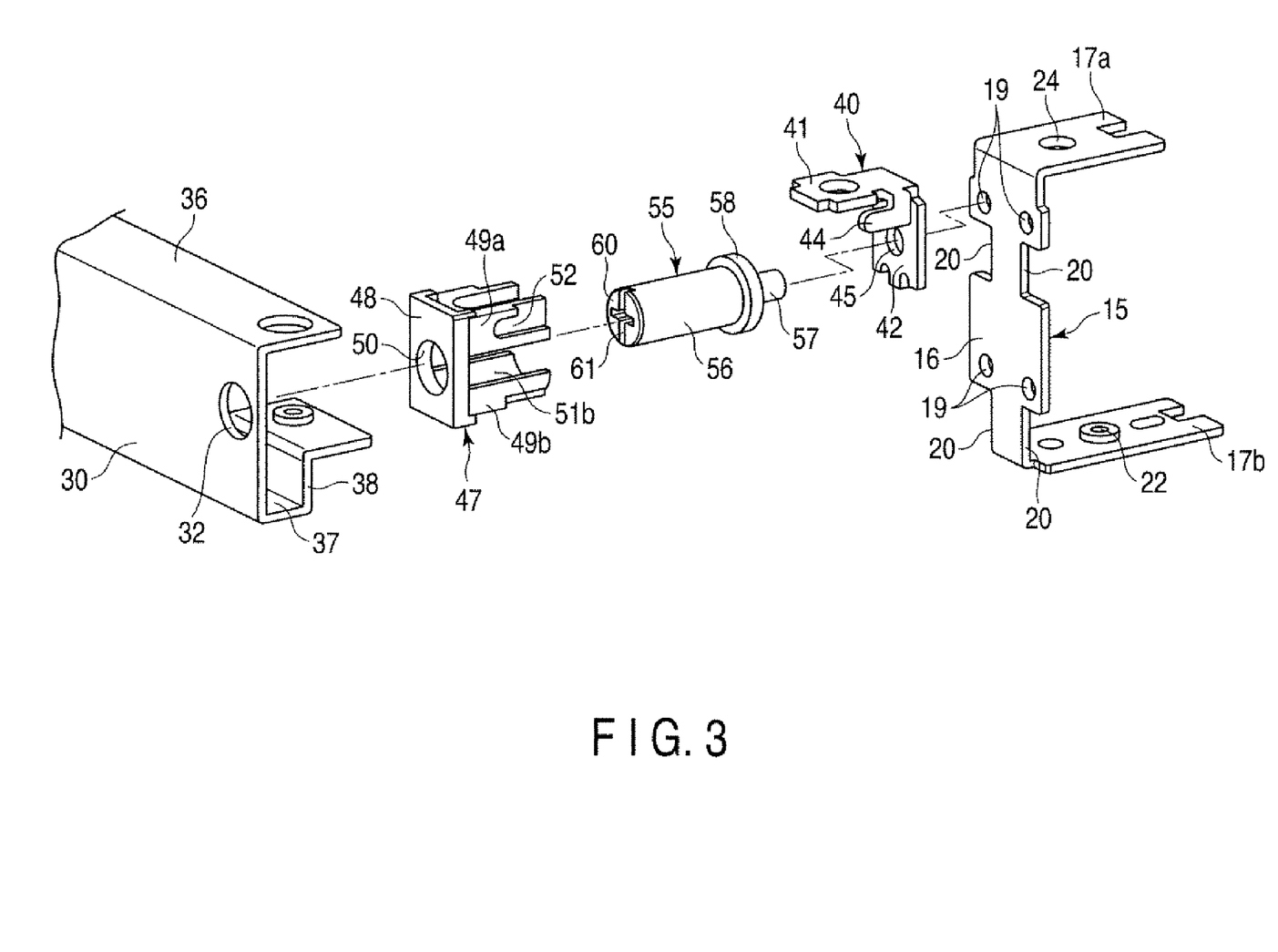
FIG. 3 is an exemplary exploded perspective view illustrating a relative positional relationship of a front panel, a guide member, a fastener, a guide fixing bracket, and a fixing bracket.

As shown in FIGS. 2, 3 and 5, the front panel 30 has an upper flange 36 and a lower flange 37. The upper flange 36 extends horizontally toward a rear side of the front panel 30 from an upper edge of the front panel 30. When the printed circuit board 29 is completely inserted into the first receptacle 10a, the upper flange 36 abuts against a front edge of the top plate 4 of the housing 2, and is flush with the top plate 4.

The lower flange 37 extends toward the rear side of the front panel 30 from a lower edge of the front panel 30. A height step portion 38, bent upward in the shape of a crank, is formed at a midpoint of the lower flange 37. A tip portion of the step height portion 38 extends horizontally to be parallel to the upper flange 36. One end portion of the printed circuit board 29 is fixed to a lower surface of the tip portion of the step height portion 38 by means of a screw cramp, for example.

As shown in FIGS. 3 and 5, a metal guide fixing bracket 40 is attached to the upper flange 36 of the front panel 30. The guide fixing bracket 40 has a bracket body 41 and a receiving portion 42.

The bracket body 41 is fixed to a lower surface of the upper flange 36 via a screw 43. Further, the bracket body 41 has a pair of fixing pieces 44, only one of which is shown. The fixing pieces 44 extend downward from the left-side edge and the right-side edge of the bracket body 41 and face each other.

The receiving portion 42 extends downward from a rear edge of the bracket body 41 and stands up to face the front panel 30. The receiving portion 42 abuts against the standing plate 16 of the fixing bracket 15 when the printed circuit board 29 is completely inserted into the first receptacle 10a.

The receiving portion 42 has a circular through hole 45. The through hole 45 is coaxially aligned with the screw hole 19 of the fixing bracket 15 when the receiving portion 42 abuts against the standing plate 16. The through hole 45 has a diameter greater than that of the screw hole 19.

The guide fixing bracket 40 has a screw guide 47 formed of synthetic resin. The screw guide 47 has an end plate 48 and a pair of guide portions 49a, 49b. The end plate 48 has a circular continuous hole 50. The end plate 48 is lapped over a back surface of the front panel 30. The continuous hole 50 is aligned with the through hole 32 of the front panel 30 and has a diameter equal to that of the through hole 32.

The guide portions 49a, 49b protrude toward the receiving portion 42 of the guide fixing bracket 40 from the back surface of the end plate 48, and are arranged in parallel to each other at an interval in a height direction of the end plate 48. The guide portions 49a, 49b have guide surfaces 51a, 51b, respectively. The guide surfaces 51a, 51b face each other and are curved in the shape of an arc. The center of the arc drawn by the guide surfaces 51a, 51b is shared.

The guide portion 49a, one of the pair of guide portions, is positioned at an upper part of the end plate 48. A concave portion 52 is formed on right and left side surfaces of the guide portion 49a, one of the pair of guide portions. The fixing piece 44 of the guide fixing bracket 40 is engaged in the concave portion 52. Thereby, the screw guide 47 is integrally held by the guide fixing bracket 40. Accordingly, the screw guide 47 is interposed between the front panel 30 and the receiving portion 42 of the guide fixing bracket 40.

As shown in FIGS. 3 and 5, the screw guide 47 supports a metal fastener 55. The fastener 55 is used to detachably fix the circuit modules 26, 27 contained in the first receptacle 10a to the housing 2. The fastener 55 has a gripper 56, a male screw portion 57, and a stopper 58.

The gripper 56 is in the shape of a column of a size which can be gripped with fingertips by the operator who handles the information processing apparatus 1. The gripper 56 penetrates through the through hole 32 of the front panel 30 and the continuous hole 50 of the screw guide 47, and is interposed between the guide portions 49a, 49b of the screw guide 47. The guide portions 49a, 49b extend in an axial direction of the gripper 56. An outer peripheral surface of the gripper 56 is knurled to prevent slipping when the gripper 56 is gripped with fingertips.

The gripper 56 has an end surface 60 exposed from the through hole 32 of the front panel 30. The end surface 60 is a flat surface in a direction crossing an axial line of the gripper 56. A slit 61 is formed in the end surface 60. The slit 61 is an example of a concave portion in which a tool 62 such as a driver can be engaged.

The male screw portion 57 coaxially protrudes from an end portion on an opposite side of the end surface 60 of the gripper 56. The male screw portion 57 can be screwed into the screw hole 19 of the fixing bracket 15 and has a diameter smaller than that of the gripper 56.

The stopper 58 is positioned between the gripper 56 and the male screw portion 57. According to the present embodiment, the stopper 58 is in the shape of a flange which is continuous with the gripper 56 in a circumferential direction, and projects laterally to the outer peripheral surface of the gripper 56 in a radial direction. An outer peripheral surface of the stopper 58 is curved in the shape of an arc and slidably contacts the guide surfaces 51a, 51b of the guide portions 49a, 49b.

Accordingly, the fastener 55 is supported by the screw guide 47 via the stopper 58. Further, the fastener 55 is lineally movable between a first position and a second position. In the first position, the stopper 58 abuts against the end plate 48 of the screw guide 47. In the second position, the stopper 58 abuts against the receiving portion 42 of the guide fixing bracket 40.

FIG. 5 discloses a state in which each of the circuit modules 26, 27 contained in the first receptacle 10a of the housing 2 is fixed to the housing 2 via the fastener 55. In FIG. 5, the male screw portion 57 of the fastener 55 penetrates through the through hole 45 of the guide fixing bracket 40 and is screwed into the screw hole 19.

As a result of the screwing, the fastener 55 is moved from the first position to the second position. In the second position, the stopper 58 of the fastener 55 abuts against the receiving portion 42 of the guide fixing bracket 40 and presses the receiving portion 42 against the standing plate 16 of the fixing bracket 15.

In other words, the stopper 58 of the fastener 55 and the standing plate 16 of the fixing bracket 15 sandwich the receiving portion 42 of the guide fixing bracket 40. As a result, the front panels 30 of the circuit modules 26, 27 are fixed to the housing 2 to block the opening 7, and the upper flange 36 of the front panel 30 is made to abut against the front edge of the top plate 4 of the housing 2.

In a state in which the male screw portion 57 of the fastener 55 is screwed into the screw hole 19, the end surface 60 of the gripper 56 having the slit 61 is positioned inside the through hole 32 of the front panel 30. That is, in the present embodiment, the end surface 60 of the gripper 56 is flush with the front surface of the front panel 30 so as not to protrude from the front surface of the front panel 30.

Figure 6:
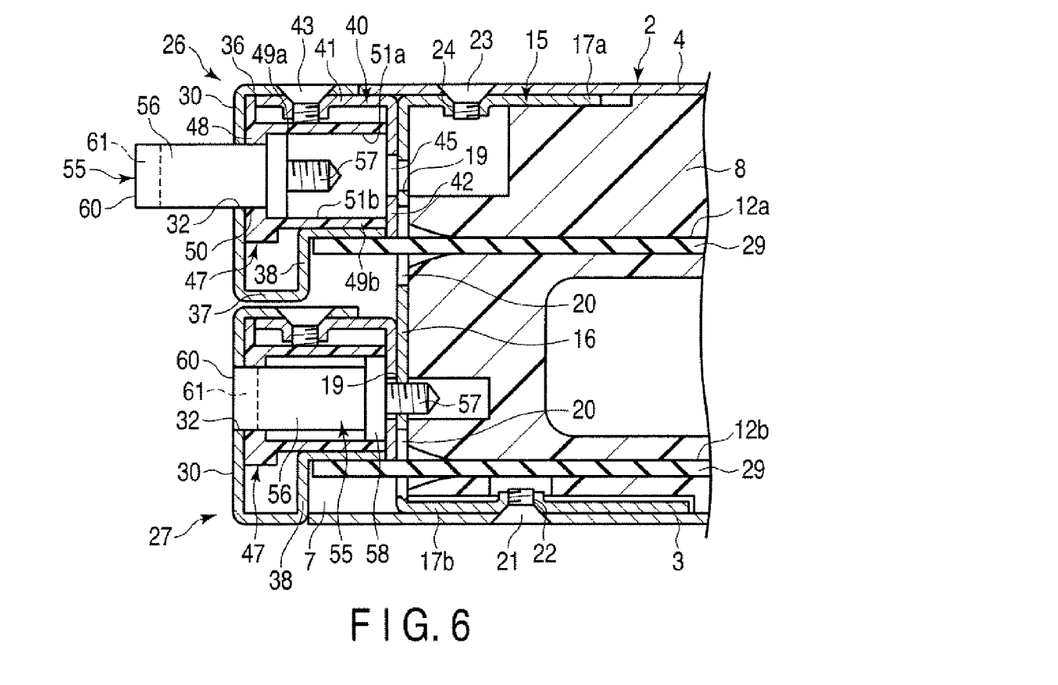
FIG. 6 is an exemplary cross-sectional view illustrating a state in which a circuit module located in an upper stage of the receptacle is unfixed according to the first embodiment of the invention.

FIG. 6 discloses a state in which the circuit module 26 is unfixed from the housing 2. In FIG. 6, the male screw portion 57 of the fastener 55 is removed from the screw hole 19 and the fastener 55 is unscrewed from the housing 2.

As a result, the fastener 55 can be moved from the second position to the first position. When the fastener 55 is moved to the first position, the stopper 58 gets caught in the end plate 48 of the screw guide 47 and holds the fastener 55 to the front panel 30 such that the fastener 55 does not drop. Further, a major part of the gripper 56 of the fastener 55 protrudes forward of the front panel 30 from the through hole 32, and the outer peripheral surface of the gripper 56 can be gripped with fingertips.

Next, the procedure for containing the circuit module 26 in the first receptacle 10a of the housing 2 will be described.

First, the printed circuit board 29 of the circuit module 26 is led to the opening 7 of the housing 2. Following that, the right end portion of the printed circuit board 29 is inserted into the first guide groove 12a and the left-side edge portion of the printed circuit board 29 is inserted into the guide groove 12c.

In this state, the printed circuit board 29 is pushed into the first receptacle 10a along the first and third guide grooves 12a, 12c. When the printed circuit board 29 is completely contained in the first receptacle 10a, the connection plug of the printed circuit board 29 engages in the connector provided in the first receptacle 10a and the front panel 30 blocks the opening 7 of the housing 2.

Next, the gripper 56 of the fastener 55, protruding from the front surface of the front panel 30, is gripped with fingertips and the gripper 56 is pushed into the through hole 32, being rotated in the fastening direction. As a result of this rotation, the male screw portion 57 of the fastener 55 is screwed into the screw hole 19 and the gripper 56 gets into the through hole 32 of the front panel 30. That is, the fastener 55 is moved from the first position to the second position.

According to the movement of the fastener 55, the amount of protrusion of the gripper 56 from the front panel 30 gradually decreases. Thereby, the gripper 56 cannot be gripped with fingertips. At the point in time when the gripper 56 cannot be gripped with fingertips, the tool 62 is inserted into the slit 61 of the end surface 60 of the gripper 56, and the tool 62 is used to rotate the fastener 55 in the fastening direction.

When the fastener 55 reaches the second position from the first position, the receiving portion 42 of the guide fixing bracket 40 is sandwiched between the stopper 58 of the fastener 55 and the standing plate 16 of the fixing bracket 15. Thereby, the front panel 30 of the circuit module 26 is fixed to the housing 2.

When the fastener 55 reaches the second position, the end surface 60 of the gripper 56 is positioned on the same surface as the front surface of the front panel 30. Accordingly, the fastener 55 is stored between the front panel 30 and the fixing bracket 15 without protruding from the front surface of the front panel 30.

Figure 7:
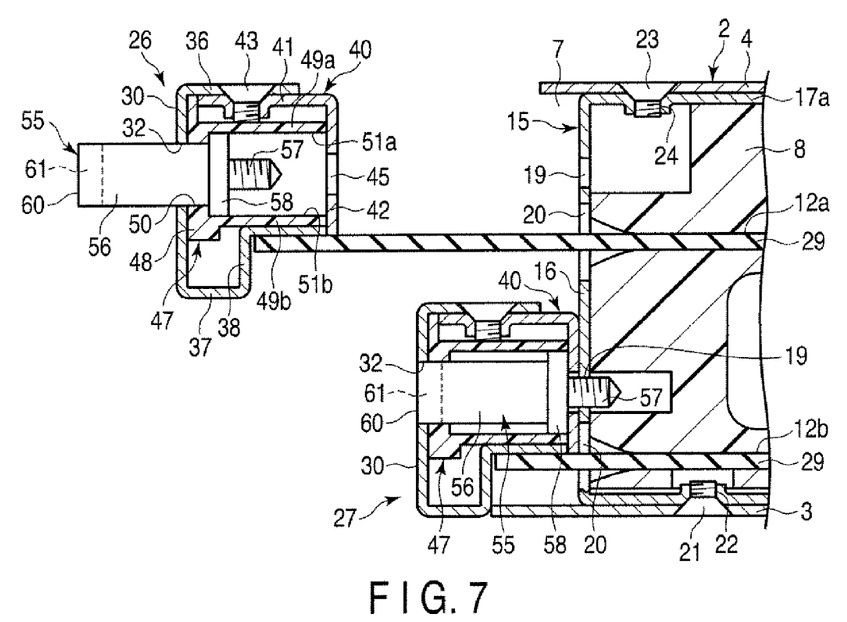
FIG. 7 is an exemplary cross-sectional view illustrating a state in which a circuit module located in an upper stage of the receptacle is pulled out from the receptacle according to the first embodiment of the invention.

In order to detach the circuit module 26 from the housing 2, the tool 62 is inserted into the slit 61 exposed from the through hole 32 of the front panel 30, and the fastener 55 is rotated in the unfastening direction using the tool 62. As a result of this rotation, the gripper 56 of the fastener 55 gradually protrudes toward the front side of the front panel 30 from the through hole 32. When the male screw portion 57 of the fastener 55 is removed from the screw hole 19, the outer peripheral surface of the gripper 56 is gripped with fingertips and the fastener 55 is pulled out toward the first position.

In the first position, the stopper 58 of the fastener 55 gets caught in the end plate 48 of the screw guide 47, and the fastener 55 is held by the front panel 30 so as not to drop. Accordingly, the circuit module 26 can be pulled out from the first receptacle 10a of the housing 2 by pulling the gripper 56 with fingertips.

According to the first embodiment of the present invention with the above-described configuration, in a state in which the front panel 30 of the circuit module 26 is fixed to the housing 2, the end surface 60 of the gripper 56 of the fastener 55 is positioned on the same surface as the front surface of the front panel 30.

It is therefore possible to obtain an outer appearance from which the gripper 56 of the fastener 55 looks as if the gripper 56 is embedded in the front panel 30, which improves unity between the front panel 30 and the gripper 56. As a result, the gripper 56 does not adversely affect the outer appearance around the front panel 30, and the information processing apparatus 1 presents a good appearance.

Further, in a state in which the circuit module 26 is fixed to the housing 2, since the gripper 56 of the fastener 55 does not protrude from the front panel 30, an extra space for containing the gripper 56 does not need to be secured in front of the housing 2. Accordingly, there is no restriction on the place where in the information processing apparatus 1 is arranged, and the information processing apparatus 1 can be mounted easily.

The fastener 55 screwed into the screw hole 19 cannot be rotated in the loosing direction unless the tool 62 is inserted into the slit 61. In other words, since the fastener 55 cannot be easily loosened with a hand, the circuit module 26 cannot be easily pulled out from the housing 2. Accordingly, it is possible to prevent the problem of accidentally touching the charger inside the housing 2, thereby enhancing security.

In addition, the LAN cable 34 can be prevented from wrapping around the gripper 56 of the fastener 55 at the time of connecting the LAN cable 34 to the LAN connector 33 of the front panel 30. Accordingly, the gripper does not interrupt the wiring operation during wiring of the LAN cable 34.

According to the first embodiment, when the fastener 55 is moved from the second position to the first position, the stopper 58 gets caught in the end plate 48 of the screw guide 47. Accordingly, the fastener 55 does not fall off from the front panel 30, and thereby the gripper 56 of the fastener 55 can be firmly gripped. Thereby, the circuit module 26 can be easily pulled out from the housing 2.

In addition, the stopper 58 of the fastener 55 is slidably held between the guide surfaces 51a, 51b of the screw guide 47. This makes the posture of the fastener 55 stable and prevents the fastener 55 from tilting or rattling when the fastener 55 is moved between the first position and the second position.

Accordingly, the coaxiality between the fastener 55 and the screw hole 19 can be maintained and the operation of screwing and unscrewing the male screw portion 57 into and from the screw hole 19 can be easily performed.

Further, in a state in which the male screw portion 57 of the fastener 55 is screwed into the screw hole 19, the guide fixing bracket 40 fixed to the front panel 30 abuts against the fixing bracket 15 fixed to the bottom plate 3 and the top plate 4 of the housing 2. Thereby, the front panel 30 is brought into the state of being electrically connected to the housing 2 via the guide fixing bracket 40 and the fixing bracket 15, and resistance of the information processing apparatus 1 to electromagnetic waves, lightening surge, and static electricity is improved.

The invention is not limited to the first embodiment and can be embodied with various modifications without departing from the spirit of the invention.

Figure 8:
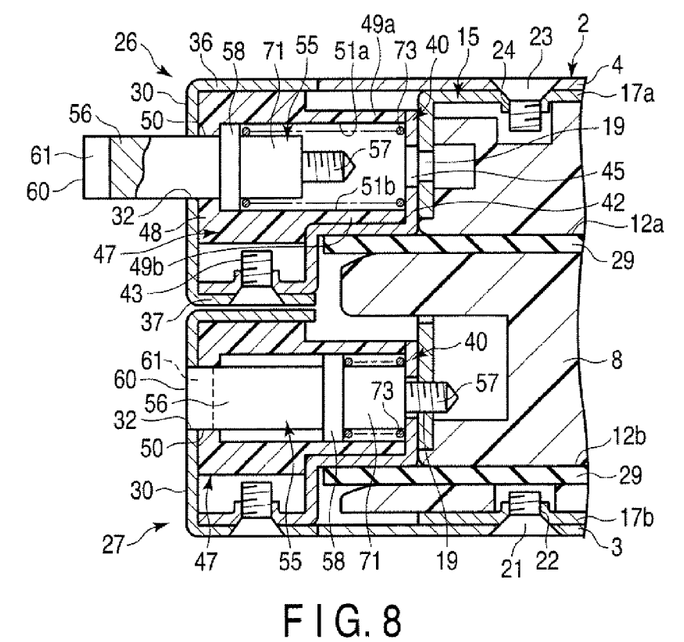
FIG. 8 is an exemplary cross-sectional view illustrating an information processing apparatus according to a second embodiment of the invention.

For example, FIG. 8 discloses a second embodiment of the invention.

The second embodiment is characterized in that the gripper 56 of the fastener 55 automatically protrudes forward of the front panel 30 when the male screw portion 57 of the fastener 55 is detached from the screw hole 19. The other configurations of the information processing apparatus 1 are basically the same as those of the first embodiment. Accordingly, in the second embodiment, the same structural elements as those of the first embodiment will be denoted by the same reference numerals and detailed descriptions of such elements will be omitted.

In the second embodiment, the guide fixing bracket 40 is fixed to the lower flange 37 of the front panel 30 via the screw 43. Further, the fastener 55 has a spring holder 71. The spring holder 71 is positioned between the stopper 58 and the male screw portion 57. The spring holder 71 is in the shape of a column coaxial with the gripper 56 and the male screw portion 57.

As shown in FIG. 8, a compression coil spring 73 is interposed between the stopper 58 of the fastener 55 and the receiving portion 42 of the guide fixing bracket 40. The compression coil spring 73 is an example of an elastic member and elastically urges the fastener 55 toward the through hole 32 of the front panel 30.

In a state in which the male screw portion 57 of the fastener 55 is screwed into the screw hole 19, an end surface on an opposite side of the stopper 58 of the spring holder 71 abuts against the receiving portion 42 of the guide fixing bracket 40. Thereby, the compression coil spring 73 is compressed between the stopper 58 and the receiving portion 42, and is held on the outer peripheral surface of the spring holder 71.

As the fastener 55 is rotated in a loosening direction, the male screw portion 57 gets out of the screw hole 19 and the stopper 58 goes away from the receiving portion 42. Thereby, the compression coil spring 73 gradually expands. When the male screw portion 57 is removed from the screw hole 19, the stopper 58 is pressed back toward the front panel 30 by the urging power of the compression coil spring 73. As a result, the gripper 56 protrudes forward of the front panel 30 from the through hole 32.

At the same time, the stopper 58 receives the urging power of the compression coil spring 73 and is pressed against a back surface of the end plate 48 of the screw guide 47. As a result, the fastener 55 is held in the first position.

According to the above-described configuration, when the male screw portion 57 of the fastener 55 is removed from the screw hole 19, the fastener 55 is elastically urged toward the first position from the second position, and the gripper 56 protrudes forward of the front panel 30.

This makes it possible to easily grip the gripper 56 with fingertips and instantly perceive that the male screw portion 57 has been removed from the screw hole 19.

Moreover, since the fastener 55 is held in the first position by the compression coil spring 73, it is possible to prevent the gripper 56 from retracting into the through hole 32 or sliding in an axial direction. This results in a stable posture of the gripper 56 and improved operability at the time of pulling out the circuit module 26 by gripping the gripper 56.

In the present invention, the concave portion of the end surface of the gripper is not limited to a slit, and may be a hexagon socket, for example. Accordingly, the tool engaged in the concave portion is not limited to the driver, and a hexagonal wrench may be used instead, for example.

Further, in the above-described embodiments, the end surface of the gripper is flush with the front surface of the front panel, but the present invention is not limited thereto. For example, the end surface of the gripper may be more deeply recessed inside the through hole than the front surface of the front panel.

While certain embodiments of the inventions have been described, there embodiments have been presented by way of example only, and are not intended to limit the scope of the invention. Indeed, the novel methods and systems described herein may be embodied in a variety of other forms; furthermore various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A fastening device comprising:
   a support having a screw hole;
   an object to be fixed having a through hole which is aligned with the screw hole, and
   a fastener which detachably fixes the object to be fixed to the support by being screwed into the screw hole from the through hole, the fastener including:
   (i) a male screw portion which is screwed into the screw hole;
   (ii) a gripper coaxially provided with respect to the male screw portion, the gripper being capable of protruding outside the object to be fixed from the through hole and getting into the through hole, and having an end surface on which a concave portion, in which a tool can be engaged, is formed on an opposite side of the male screw portion; and
   (iii) a stopper positioned between the male screw portion and the gripper, the stopper being radially outward of the male screw portion and the gripper,
   the object to be fixed being fixed to the support via the fastener and the end surface of the gripper being positioned inside the through hole, in a state in which the male screw portion of the fastener is screwed into the screw hole, and
   the gripper protruding outside of the object to be fixed from the through hole and the stopper being caught in the object to be fixed and holding the fastener to the object to be fixed, in a state in which the fastener is loosened and the male screw portion is removed from the screw hole.

2. The fastening device of claim 1, wherein the end surface of the gripper is flush with an outer surface of the object to be fixed in a state in which the male screw portion of the fastener is screwed into the screw hole.

3. The fastening device of claim 2, wherein the stopper is shaped like a flange which is continuous in a circumferential direction of the gripper, the object to be fixed has a guide portion which an outer circumferential surface of the stopper slidably contacts, and the guide portion extends in an axial direction of the gripper.

4. The fastening device of claim 3, wherein the object to be fixed has a receiving portion, the receiving portion receiving the stopper and abutting against the support when the male screw portion is screwed into the screw hole.

5. The fastening device of claim 1, further comprising an elastic member which elastically urges the fastener toward the through hole.

6. A module mounting mechanism comprising:
a receptacle having an opening and a screw hole facing the opening;
a module detachably inserted into the receptacle from the opening and having a through hole which is aligned with the screw hole; and
a fastener which detachably fixes the module to the receptacle by being screwed into the screw hole from the through hole when the module is inserted into the receptacle, the fastener including:
(i) a male screw portion which is screwed into the screw hole;
(ii) a gripper coaxially provided with respect to the male screw portion, the gripper being capable of protruding outside the module from the through hole and getting into the through hole, and having an end surface on which a concave portion, in which a tool can be engaged, is formed on an opposite side of the male screw portion; and
(iii) a stopper positioned between the male screw portion and the gripper, the stopper being radially outward of the male screw portion and the gripper,
the module being fixed to the receptacle via the fastener and the end surface of the gripper being positioned inside the through hole, in a state in which the male screw portion of the fastener is screwed into the screw hole, and
the gripper protruding outside of the module from the through hole and the stopper being caught in the module and holding the fastener to the module, in a state in which the fastener is loosened and the male screw portion is removed from the screw hole.

7. The module mounting mechanism of claim 6, wherein the module has an outer surface exposed to an outside of the receptacle, and the end surface of the gripper is flush with the outer surface of the module in a state in which the male screw portion of the fastener is screwed into the screw hole.

8. The module mounting mechanism of claim 7, wherein the stopper is shaped like a flange which is continuous in a circumferential direction of the gripper, the module has a guide portion which an outer peripheral surface of the stopper slidably contacts, and the guide portion extends in an axial direction of the gripper.

9. The module mounting mechanism of claim 8, wherein the module has a receiving portion which receives the stopper when the male screw portion is screwed into the screw hole.

10. The module mounting mechanism of claim 9, wherein the receptacle has a wall which guides an insertion direction of the module and a fixing bracket held at an end portion facing the opening of the wall, the screw hole is formed in the fixing bracket, and the receiving portion of the module abuts against the fixing bracket when the male screw portion of the fastener is screwed into the screw hole.

11. The module mounting mechanism of claim 10, wherein the stopper of the fastener and the fixing bracket sandwich the receiving portion of the module when the male screw portion is screwed into the screw hole.

12. The module mounting mechanism of claim 6, further comprising an elastic member which elastically urges the fastener toward the through hole.

13. An information processing apparatus comprising:
a housing including a receptacle, an opening which is continuous with the receptacle, and a screw hole facing the opening;
a circuit module having a circuit board detachably inserted into the receptacle of the housing, and a front panel provided at one end of the circuit board, the front panel having a through hole which is aligned with the screw hole and closing the opening when the circuit board is inserted into the receptacle; and
a fastener which detachably fixes the circuit module to the housing by being screwed into the screw hole from the through hole when the circuit board is inserted into the receptacle, the fastener including:
(i) a male screw portion which is screwed into the screw hole;
(ii) a gripper coaxially provided with respect to the male screw portion, the gripper being capable of protruding outside the front panel from the through hole and getting into the through hole, and having an end surface on which a concave portion, in which a tool can be engaged, is formed on an opposite side of the male screw portion; and
(iii) a stopper positioned between the male screw portion and the gripper, the stopper being radially outward of the male screw portion and the gripper,
the circuit module being fixed to the housing via the fastener and the end surface of the gripper being positioned inside the through hole of the front panel, in a state in which the male screw portion of the fastener is screwed into the screw hole, and
the gripper protruding outside of the front panel from the through hole and the stopper being caught in the front panel and holding the fastener to the front panel, in a state in which the fastener is loosened and the male screw portion is removed from the screw hole.

14. The information processing apparatus of claim 13, wherein the front panel has an outer surface exposed to an outside of the housing, and the end surface of the gripper is flush with the outer surface of the front panel in a state in which the male screw portion of the fastener is screwed into the screw hole.

15. The information processing apparatus of claim 14, wherein the stopper is shaped like a flange which is continuous in a circumferential direction of the gripper, the front panel has a guide portion which an outer circumferential surface of the stopper slidably contacts, and the guide portion extends in an axial direction of the gripper.

16. The information processing apparatus of claim 14, wherein each of the housing and the front panel of the circuit module has conductivity, the front panel including a metal receiving portion which receives the stopper when the male screw portion is screwed into the screw hole, and the receiving portion being electrically connected to the front panel, and
the receptacle of the housing includes a wall which guides an insertion direction of the circuit board and a fixing bracket held at an end portion facing the opening of the wall, and the fixing bracket being electrically connected to the housing, the screw hole being formed in the fixing bracket, and the receiving portion of the front panel abutting against the fixing bracket when the male screw portion of the fastener is screwed into the screw hole.

17. The information processing apparatus of claim 16, wherein the stopper of the fastener and the fixing bracket sandwich the receiving portion when the male screw portion is screwed into the screw hole.

18. The information processing apparatus of claim 13, wherein the front panel has a connector used to connect a cable.

19. The information processing apparatus of claim 13, further comprising an elastic member which elastically urges the fastener toward the through hole.

* * * * *